US011975629B2

(12) United States Patent
Hellgren (10) Patent No.: US 11,975,629 B2
(45) Date of Patent: May 7, 2024

(54) METHOD AND SYSTEM FOR ESTIMATING BATTERY PROPERTIES IN A VEHICLE DRIVE SYSTEM

(71) Applicant: VOLVO TRUCK CORPORATION, Gothenburg (SE)

(72) Inventor: Jonas Hellgren, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 846 days.

(21) Appl. No.: 17/040,791

(22) PCT Filed: Apr. 6, 2018

(86) PCT No.: PCT/EP2018/025096
§ 371 (c)(1),
(2) Date: Sep. 23, 2020

(87) PCT Pub. No.: WO2019/192670
PCT Pub. Date: Oct. 10, 2019

(65) Prior Publication Data
US 2021/0009002 A1    Jan. 14, 2021

(51) Int. Cl.
*B60L 58/10*    (2019.01)
*B60K 1/04*    (2019.01)
(Continued)

(52) U.S. Cl.
CPC ............... *B60L 58/10* (2019.02); *B60K 1/04* (2013.01); *G01R 31/367* (2019.01);
(Continued)

(58) Field of Classification Search
CPC ... B60L 58/10; G01R 31/3842; G01R 31/367; G01R 31/374
(Continued)

(56) References Cited

U.S. PATENT DOCUMENTS

2007/0005276 A1*  1/2007  Cho ..................... B60L 58/12
                                                    702/60
2010/0042345 A1    2/2010  Kang et al.
(Continued)

FOREIGN PATENT DOCUMENTS

WO        2013016188 A1    1/2013
WO    WO 2013/016188    *    1/2013

OTHER PUBLICATIONS

Neural Networks for Adaptive Control, Dewen Hu et al., p. 312, National University of Defense Technology Press, 9 pages.
(Continued)

*Primary Examiner* — Nathaniel R Pelton
(74) *Attorney, Agent, or Firm* — Venable LLP; Jeffri A. Kaminski (57) ABSTRACT

The invention relates to a system for and method of determining a model for estimating battery properties in a hybrid or electrical drive system (900) for a vehicle (902), the method comprising: providing (51) a function approximator estimating a battery property as a function of two or more measured battery parameters; providing (52) a stream of measured battery parameter values as a function of time for a predetermined period to a predetermined battery cell model describing the relationship between the measured battery parameter and the battery property; determining (S3) a battery property value using the cell model based on a selected portion of the stream of measured battery parameter values; determining (S4) if a predetermined condition for the selected portion of the stream of measured battery parameter values is fulfilled; and if (S5) the predetermined condition is fulfilled, updating (S6) the function approximator based on the battery property value determined by the cell model.

17 Claims, 5 Drawing Sheets

(51) Int. Cl.
  *G01R 31/367* (2019.01)
  *G01R 31/374* (2019.01)
  *G01R 31/3842* (2019.01)
(52) U.S. Cl.
  CPC ....... *G01R 31/374* (2019.01); *G01R 31/3842* (2019.01); *B60L 2240/54* (2013.01)
(58) Field of Classification Search
  USPC ......................................................... 320/134
  See application file for complete search history.

(56) References Cited

U.S. PATENT DOCUMENTS

2010/0185405 A1    7/2010  Aoshima et al.
2010/0324848 A1*  12/2010  Cho ..................... B60L 3/0046
                                                         702/63
2012/0266431 A1   10/2012  Hahn et al.
2015/0355282 A1   12/2015  Ha et al.
2017/0315179 A1   11/2017  Baba et al.

OTHER PUBLICATIONS

Chinese Office Action dated Nov. 3, 2022 in corresponding Chinese Patent Application No. 201880092017.0, 15 pages.
International Search Report and Written Opinion dated Jan. 7, 2019 in corresponding International PCT Application No. PCT/EP2018/025096, 13 pages.
International Preliminary Report on Patentability dated Jul. 22, 2020 in corresponding International PCT Application No. PCT/EP2018/025096, 20 pages.

* cited by examiner

METHOD AND SYSTEM FOR ESTIMATING BATTERY PROPERTIES IN A VEHICLE DRIVE SYSTEM

CROSS-REFERENCE TO RELATED APPLICATIONS

This application is a U.S. National Stage application of PCT/EP2018/025096, filed Apr. 6, 2018, and published on Oct. 10, 2019, as WO 2019/192670 A1, all of which is hereby incorporated by reference in its entirety.

TECHNICAL FIELD

The invention relates to a method and a system for estimating battery parameters in a hybrid or electrical drive system for a vehicle.

The invention can be applied in heavy-duty vehicles, such as trucks, buses and construction equipment. Although the invention will be described with respect to a truck, the invention is not restricted to this particular vehicle, but may also be used in other vehicles.

BACKGROUND

In a hybrid or electric vehicle, it is important to have a good knowledge of battery properties for various operating conditions. To achieve that, an electric vehicle often comprises a battery management system tasked with monitoring the status of the battery.

In particular, objectives of the battery management system are (1), energy level state monitoring, i.e. state of charge estimation (2), power capacity state monitoring (3), maintaining of safe operation of the battery pack (4), state of health estimation and (5) ensuring that the cells in the battery pack are balanced. Sensor signals, such as voltage, current and temperature, are combined with mathematical models to achieve the previously listed objectives. The mathematical models include parameters describing cell properties such as for example resistance, capacity and open circuit voltage. Setting of these parameters is essential for efficient state monitoring. Typically the cell parameter setting is performed in a laboratory enabling good control of cell load, temperature etc.

However, the properties of battery cells vary between cells and also over time. The reasons for the variation may be production related and the cell properties change over time due to degradation of the battery cell, where the change may be different in different battery cells.

In particular parameters such as the battery impedance depends on multiple operating conditions. Accordingly, the cell resistance cannot be assumed to be constant because it varies highly on for example temperature. Impedance is valuable to keep track of also when the battery is in use of a vehicle. One reason is that state-of-charge (SoC) estimation accuracy is improved if the battery impedance is known. Another reason is that the battery impedance may indicate battery cell degradation. Typically, resistance increases and capacity decreases as the cell ages.

Accordingly, there is a need for a system and a method for estimating and predicting slowly varying battery parameters of battery cells used in vehicles.

SUMMARY

An object of the invention is to provide an improved method and system for estimating battery parameters in a vehicle comprising an electrical drive system, such as a hybrid vehicle.

According to a first aspect of the invention, the object is achieved by a method according to claim 1.

The first aspect of the invention relates to a method of determining a model for estimating battery properties in a hybrid or electrical drive system for a vehicle. The method comprises: providing a function approximator estimating a battery property as a function of two or more measured battery parameters; providing a stream of measured battery parameter values as a function of time for a predetermined period to a predetermined battery cell model describing the relationship between the measured battery parameter and the battery property, determining a battery property value using the cell model based on a selected portion of the stream of measured battery parameter values; determining if a predetermined condition for the selected portion of the stream of measured battery parameter values is fulfilled; and if the predetermined condition is fulfilled, updating the function approximator based on the battery property value determined by the cell model.

The function approximator is here defined as a module approximating a function based on an input comprising a number of measured values. Accordingly, the target function for the function approximator is not known, the target function is instead the function best describing the behavior of a variable as a function of the measured values. In the present context, the measured values are battery parameter values and the function approximator approximates a function describing a relationship between a battery property and the measured battery parameter values.

The predetermined battery cell can be assumed to describe the relationship between the measured battery parameter and the battery property for a cell type of a battery for which it has been trained. Thereby, the function approximator can be updated using a battery property value determined by the cell model if a predetermined condition describing the selected portion of the stream of measured battery parameter values is fulfilled. Accordingly, the function is subject to training in the vehicle and is adapting to changing properties of the battery resulting occurring as the battery is aging. Moreover, the cell model contains variable parameters that depends on the operating point of the battery, where the operating point for example is dependent on the temperature, which are taken into account when determining the battery property values. Thereby, the cell model can be used to train and update the function approximator as the battery ages and for different operating conditions.

An advantage of the described invention is that the behavior of a slowly changing battery property can be described by the function approximator. This allows for a better prediction of the battery behavior for a given operating condition. Moreover the function approximator is capable of predicting the battery property behavior also outside of the range of battery parameter values for which it has been trained. Thereby, a tool for estimation of slowly varying battery parameters is provided. The function approximator may for example advantageously be used when performing a cold start, i.e. when the battery is at a low temperature. Even if there is no or little prior information of the battery behavior at a temperature which is outside of normal operating temperatures, the function approximator can provide a reasonable estimation of battery properties for a given operating point.

According to one embodiment of the invention, determining if a predetermined condition is fulfilled comprises, for the selected portion of the stream of measured battery parameter values: determining if a predetermined time period has passed since the most recent update of the function approximator; determining if a standard deviation of a measured current exceeds a predetermined threshold; determining if a maximum current derivative occurs before the middle of the selected portion; and/or determining if a maximum current derivative exceeds a predetermined threshold.

According to one embodiment of the invention, the method may further comprise: if each of the plurality of determined conditions are fulfilled, determining a battery property value using the cell model based on the stream of measured battery parameter values; and updating the function approximator based on the battery property value determined by the cell model. Accordingly, it may be required that all of the above discussed conditions are fulfilled before the function approximator is updated. Thereby, it can be ensured that the battery system is excited when the function approximator is updated. Measured battery parameters acquired during a steady condition of the battery may provide less information compared to battery parameters measured during a change in e.g. load of the battery. Thereby, it is advantageous to update the function approximator when the battery system is in an excited state as defined by the above conditions.

According to one embodiment of the invention the measured battery parameters comprises at least two of $i_{cell}$, T and, $u_{cell}$. Here, $i_{cell}$ is the current from the battery, T is the temperature of the battery, $u_{cell}$ is the voltage over the battery cell.

According to one embodiment of the invention, the determined battery property is at least one of $R_0$, $R_1$ and C in an equivalent circuit representing the battery cell. In the present context, $R_0$ is the internal resistance of the battery, $R_1$ can be seen as a polarization resistance and C is the battery cell capacitance. By measuring the above mentioned battery parameters, and providing the battery parameter values to a cell model, values for the described battery properties can be calculated.

According to one embodiment of the invention, providing the function approximator comprises training the function approximator for a specific battery type prior to applying the function approximator in the drive system in a vehicle. Accordingly, the function approximator may be pre-conditioned for a specific battery type. The training of the function approximator allows it to provided an initial function describing the battery properties. Thereby, adjustments of the model during operation can be reduced such that the function approximator can provide more reliable estimates from the start.

According to one embodiment of the invention, the selected portion of the stream of measured battery parameter values may advantageously be selected using a moving time window. Thereby, the selected portion is always of the same length. Accordingly, for each selected window, it is determined if the predetermined conditions are fulfilled or not, and if an update of the function approximator is to be performed.

According to one embodiment of the invention, the method the method may further comprise determining a state of charge based on the measured battery parameter values. When determining properties in the cell model, the open circuit voltage is derived. The open circuit voltage is in turn related to the state of charge, hence an estimated state of charge is also a result.

According to one embodiment of the invention, the function approximator may advantageously utilizes a tile coding model, the tile coding model comprising a plurality of at least partially overlapping layers having predetermined relative layer offsets and layer weights based on an expected behavior of the battery property for a known battery type. Tile coding is a single- or multiple-input, single-output function approximator originating from the field of artificial intelligence. An advantage of using a function approximator based on a tile coding model is that it is more easily understandable and can thereby be understood intuitively and modified to fit to a certain battery type. However, it is also possible to use other types of function approximators, such as a neural network.

According to one embodiment of the invention, the plurality of at layers in the tile coding model are advantageously arranged so that there are more overlapping layers in a region where the battery property is expected to exhibit higher variability compared to in a region where the battery property is expected to exhibit lower variability. This provides a higher resolution in the region where higher variability is expected. Moreover, the layers are advantageously arranged so that a layer at one extreme of a parameter value range does not reach the opposite extreme of the parameter value range.

According to one embodiment of the invention, updating the function approximator may comprise modifying a layer offset of at least one layer of the tile coding model. Thereby, by changing the relative position of the layer the model changes for the entire parameter range covered by the specific layer to provide a form of generalization. This is advantageous since the model learns also for parameter values outside of the measured values.

According to one embodiment of the invention, updating the function approximator may advantageously comprise modifying a weight of a layer of at least one layer of the tile coding model. Thereby, as discussed above, the function approximator is adapting to the updated battery property value for an expanded range of parameter values. It should be noted that when a tile coding model is used, the position and weight of the layers may be trained in an offline environment for a given battery type prior to being used in a vehicle.

There is also provided a computer program comprising program code means for performing the steps of any the aforementioned embodiments when the program is run on a computer, and a computer readable medium carrying a computer program comprising program code means for performing the steps of any of the embodiments when the program product is run on a computer.

According to a second aspect of the invention, the object is achieved by a system according to claim 15.

The second aspect of the invention relates to an electrical drive system for a vehicle. The drive system comprises: an electrical motor arranged to power to a propulsion system of a vehicle; at least one battery connected to the electrical motor to provide power to the electrical motor; a drive system control unit configured to: provide a stream of measured battery parameter values as a function of time for a predetermined period to a predetermined battery cell model describing the relationship between the measured battery parameter and the battery property; determine a battery property value using the cell model based on a selected portion of the stream of measured battery parameter values; determine if a predetermined condition for the selected portion of the stream of measured battery parameter values is fulfilled; and if the predetermined condition is fulfilled, update a function approximator estimating a battery property as a function of two or more measured battery parameters based on the battery property value determined by the cell model.

Effects and features of this second aspect of the present invention are largely analogous to those described above in connection with the first aspect of the invention.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings:

FIG. 2 is a cell model describing a battery cell, FIG. 3 schematically illustrates measured battery parameter values used by a method according to an embodiment of the invention, FIG. 4 schematically illustrates measured battery parameter values used by a method according to an embodiment of the invention, FIG. 5 schematically illustrates features of a model used in a method according to an embodiment of the invention, FIG. 6 schematically illustrates features of a model used in a method according to an embodiment of the invention, FIG. 7 schematically illustrates features of a model used in a method according to an embodiment of the invention, FIGS. 8A-C schematically illustrate features of a model used in a method according to an embodiment of the invention, and FIG. 9 schematically illustrates an electrical drive system 900 for a vehicle according to an embodiment of the invention.

DETAILED DESCRIPTION OF EXAMPLE EMBODIMENTS OF THE INVENTION

In the present detailed description, various embodiments of a method and system according to the present invention are mainly discussed with reference to a method of determining a model for estimating battery properties in a hybrid or electrical drive system for a vehicle, where the a function approximator in the form of a tile coding model is used. It should be noted that this by no means limits the scope of the present invention which is equally applicable to other function approximators.

Figure 1:
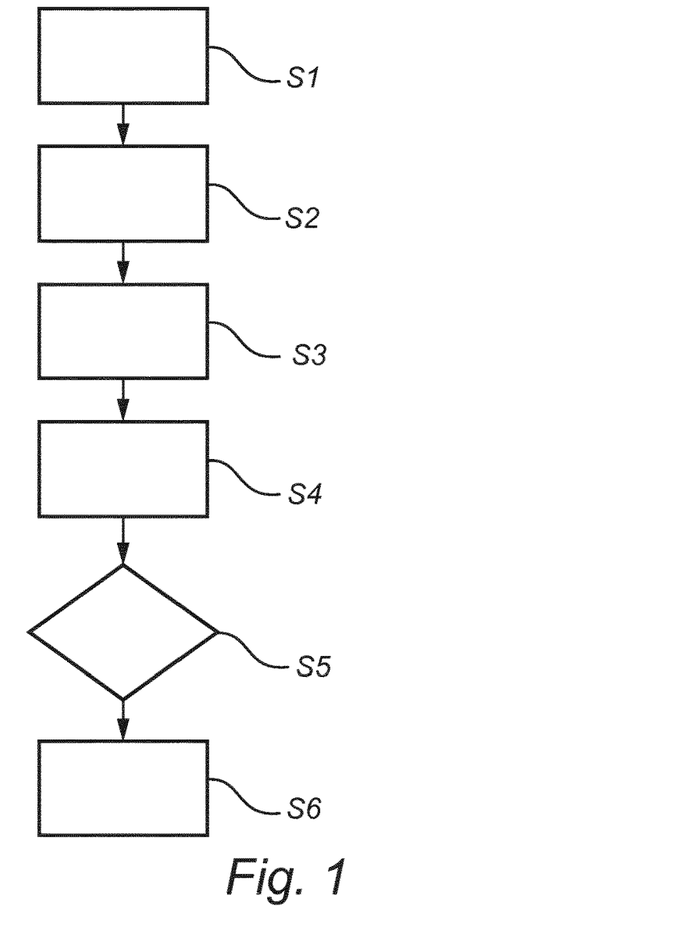
FIG. 1 is a flow chart outlining the steps of a method according to an embodiment of the invention.
Figure 2:
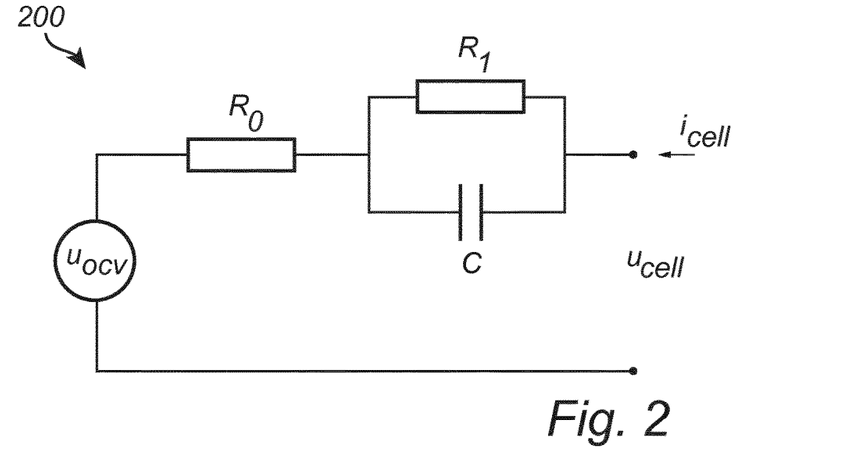

FIG. 1 is a flow chart outlining the general steps of a method of determining a model for estimating battery properties in a hybrid or electrical drive system for a vehicle according to an embodiment of the invention. The method will be described with further reference to FIG. 2 illustrating a cell model comprising an equivalent circuit of a battery cell for analytically describing the relation between the measured battery parameters $i_{cell}$, T and, $u_{cell}$ and the battery properties $R_0$, $R_1$ and C. Here, the inner resistance $R_0$ is important since it determines how the battery responds to a current request.

The method comprises providing S1 a function approximator estimating a battery property as a function of two or more measured battery parameters. The function approximator is here a tile coding model comprising a plurality of at least partially overlapping layers having predetermined relative layer offsets and layer weights based on an expected behavior of the battery property for a known battery type. The tile coding model will thus describe a selected battery property as a function of at least two of the measured battery parameters. Accordingly, at least three separate tile coding models are required for describing the three battery properties of interest $R_0$, $R_1$ and C.

Figure 3:
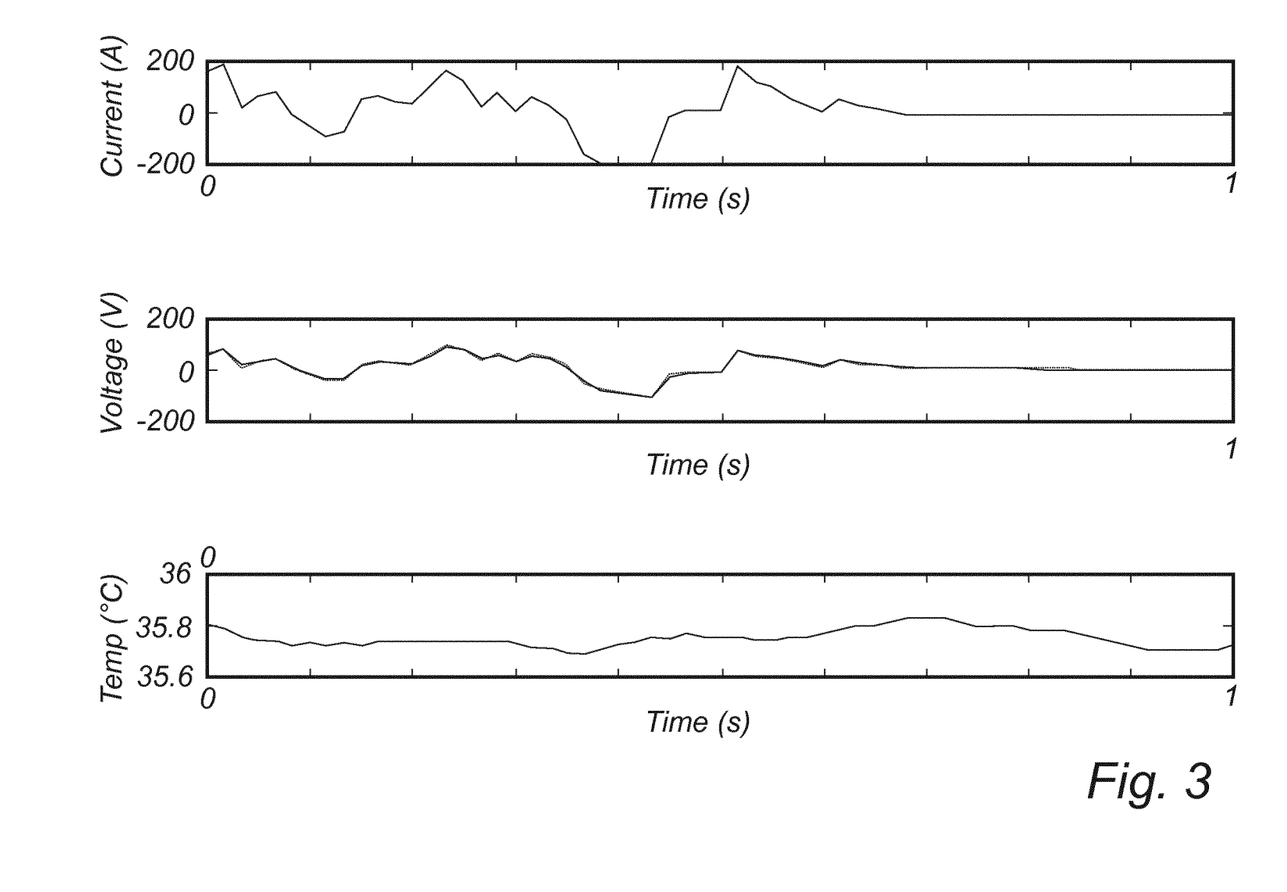

FIG. 3 schematically illustrates the battery current $i_{cell}$, battery temperature T and battery voltage $u_{cell}$ as a function of time. It should however be noted that also other properties may be modelled and other parameters may be measured, and that the described method is not limited to the examples provided in the present description. Further details describing the tile coding model will be discussed in the following.

Next, the method comprises providing S2 a stream of measured battery parameter values as a function of time for a predetermined period to the predetermined battery cell model describing the relationship between the measured battery parameter and the battery property. Using the cell model, a battery property value can be determined determining S3 based on a selected portion of the stream of measured battery parameter values.

Figure 4:
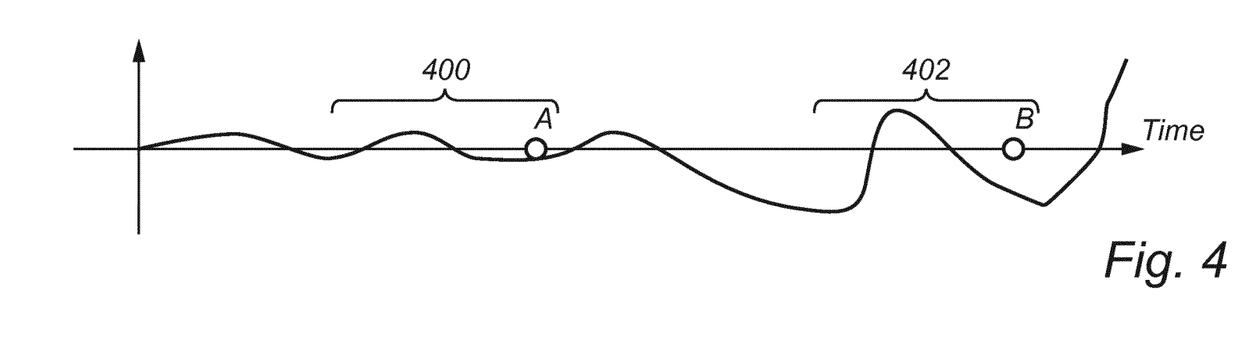
Figure 5:
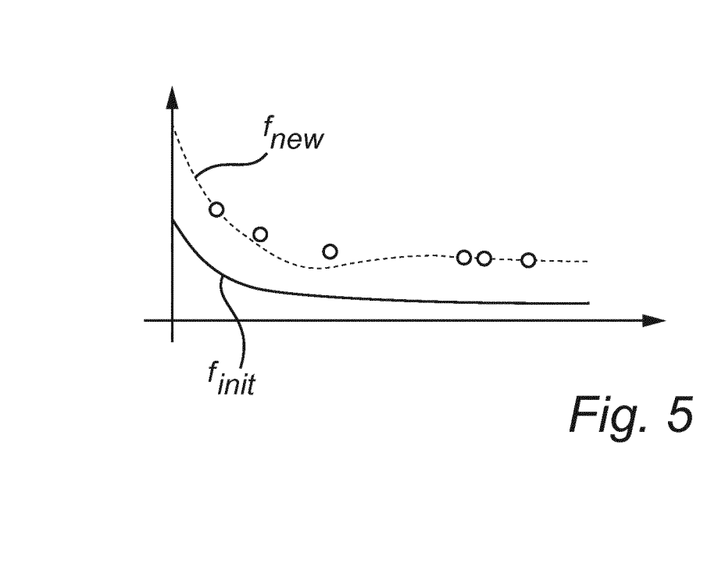

In the following step, it is determined S4 if a predetermined condition for the selected portion of the stream of measured battery parameter values is fulfilled, where FIG. 4 schematically illustrates a first selected portion 400 and a second selected portion 402. The selected portions may also be referred to as time windows. If S5 the predetermined condition is fulfilled, the function approximator is updated S6 based on the battery property value determined by the cell model.

The time window may for example cover the last minute. If it is determined that the predetermined condition is fulfilled, the measured battery parameter values are provided to the cell model where a so called system identification is performed. As an example, the measured battery parameters may be current and voltage, where the measured current for the time window is provided to the cell model. The cell model may then estimate the voltage, compare the estimated voltage with the measured voltage and adjust the cell model parameters to achieve the best fit between the calculated and measured voltage. Once a good fit is achieved, it can be assumed that the cell model accurately describes the battery for the given time window. Thereby, a battery property value of interest, such as $R_0$, can be extracted from the cell model and the function approximator can be updated using the battery property value.

The step of determining if the predetermined condition is fulfilled here comprises determining if a number of conditions are fulfilled for a selected portion. The conditions that need to be fulfilled for the function approximator to be updated include:
- determining if a predetermined time period has passed since the most recent update of the function approximator;
- determining if a standard deviation of a measured current exceeds a predetermined threshold;
- determining if a maximum current derivative occurs before the middle of the selected portion; and
- determining if a maximum current derivative exceeds a predetermined threshold.

When comparing the first selected portion 400 and the second selected portion 402, it can be seen that both the standard deviation of the current and the maximum current derivative is larger in the second portion 402. Accordingly, the second time window 402 is more likely to trigger an update of the function approximator than the first time window 400. As described above, threshold values are defined which determine if the conditions are fulfilled or not. The threshold values determining if the conditions are fulfilled or not may for example be derived empirically for a certain battery type and drive system so that the function approximator is updated with sufficient frequency to maintain an accurate approximation.

In the following, it will be described how the function approximator, i.e. how the tile coding model is set. The task at hand is schematically described in FIG. 6 wherein an initial estimation of the function, $f_{init}$, is known. From three data points, illustrated by the filled circles, information is available from an updated version of the function $f_{new}$. Next, the updated function $f_{new}$ is evaluated by three evaluation points illustrated by the non-filled circles. The distance between the evaluation points and $f_{new}$ is a measure of how well the function is trained. If the function is properly expressed, $f_{new}$ shall correlate well with the evaluation points. Another way to express this is that a function approximator that converges quickly from a small training set is desired. The problem is relevant for battery parameter estimation because the battery may in practice only operate in specific temperature/SoC/etc. regions. The concept of generalization is thus relevant here. Generalization here means that experience in specific regions "spills over" to other regions. A simple look-up table is not good enough since it has a minimal amount of generalization.

Tile coding is a single- or multiple-input, single-output function approximator. The technique originates from the field artificial intelligence and is described further in for example. Central in tile coding is tiles and layers (sometimes referred to as tilings). A illustrative example follows to explain the terms used, as defined in the table below.

| Term | Setting | Description |
|---|---|---|
| $n_{dim}$ | 2 | Number of dimensions |
| $n_{tilesdim}$ | [2 2] | Number of tiles per dimension |
| $n_{layers}$ | 2 | Number of layers |
| 01 | [0 0] | Offset of layer 1 |
| 02 | [0.25 0.25] | Offset of layer 2 |
| x | [0.6 0.6] | X value |

Figure 6:
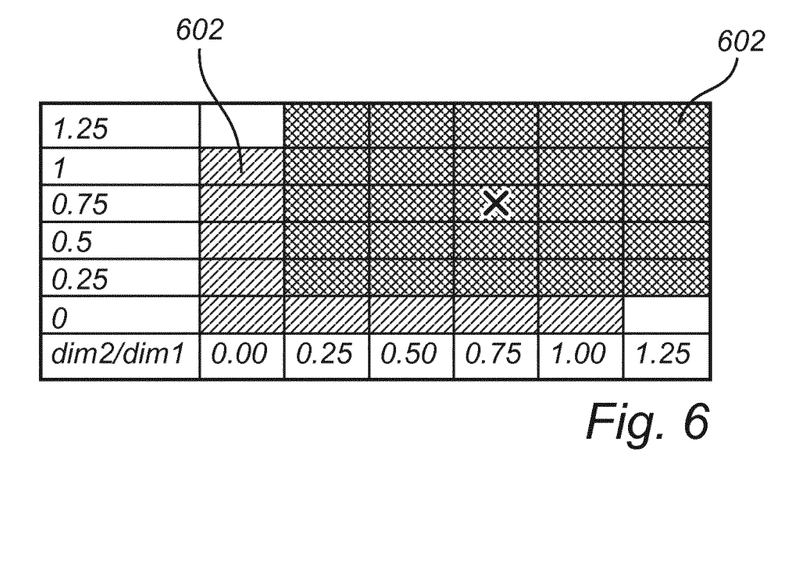

FIG. 6 illustrates a first layer 600, layer 1, and a second layer 602, layer 2, which has an offset with respect to layer 1. The question at hand is: which tiles are "active" for a specific x-value, here illustrated by X in FIG. 6. The tile number to is defined as:

$$tn = \begin{cases} \left[\sum_{di=1...n_{dim}} b(di) \cdot [sidx(di-1)]\right] + 1 & (sidx(di) \neq 0 \ \forall \ di) \\ 0 & (\text{else}) \end{cases}$$

$$b(di) = \begin{cases} 1 & (di = 1) \\ \prod_{i=2...di} n_{tilesdim}(i-1) & \text{else} \end{cases}$$

Where sidx is the indexes of the active segments, i.e. sections in a specific dimension. It is now possible to define the tile number for x in FIG. 6. For this tile code setting b is [1 2]. One reflection is that the x-value is located in different tiles for the two layers. The reason is that the second layer 602 has an offset in both dimensions. Imagine now instead a x-value value of [0.1 0.1]. This would trigger a tile in the first layer 600, which happens to have number 1. No tile in layer 2 is active by this x-value. Accordingly, an x-value activates one or zero tiles in a specific layer.

For a specific data point x the output function $f(x)$ is defined as:

$$f(x) = \sum_{li=1...n_{layers}} \sum_{ti=1...n_{tiles}} \phi(x, li, ti) \cdot w(li, ti)$$

Where the vector w is the weight. The weight defines the "value contribution" from every active tile in every layer. It resembles the parameters to be identified in traditional regression analysis. The phi vector $\phi$ can be regarded as a binary string presenting the tiles activated for a specific x-state. A specific element in the phi vector is defined as:

$$\phi(x, li, ti) = \begin{cases} 1 & (\text{if } x \text{ is in tile } ti \text{ in layer } li) \\ 0 & (\text{else}) \end{cases}$$

For the example, the function $\phi$ for x=[0.6 0.6] is defined by the following table:

| | Tile | | | |
|---|---|---|---|---|
| Layer | 1 | 2 | 3 | 4 |
| 1 | 0 | 0 | 0 | 1 |
| 2 | 1 | 0 | 0 | 0 |

The offset of layers are restricted by a specific distance. The distance is the length of the dimension divided by the number of tiles on that dimension. The more layers the smaller is the offset. The matrix onorm contains elements with values in [0, 1] according to $$o(li, di) = \text{onorm}(li, di) \cdot \text{lendim}(di)/n_{tiles}(di)$$

Assuming that the reference target function value is $f_{ref}$, the weights need to be updated so that the function output from tile coding $f(x)$ approaches $f_{ref}(x)$. This can be achieved by utilizing gradient based search and the fact that it is possible to define the partial derivate of $f(x)$ with respect to w. The weights corresponding to each layer li is updated according to $$w(li) \leftarrow w(li) + \frac{\alpha}{n_{layers}} \cdot (f_{ref}(x) - f(x)) \cdot \frac{\partial f}{\partial w}(x, li)$$

where $$\frac{\partial f}{\partial w}(x, li) = \phi(x, li)$$

The step-size parameter $\alpha$ determines how far the function's output should be shifted towards the training data point. The binary vector $\phi(x, li)$ permits updates only to tiles active at x.

Next, generalization occurs to states other than the one trained if those states fall within any of the same layers. The number of layers and offset of the layers from each other affects generalization. In the following example, the effect and importance of generalization will be illustrated. Two proposed settings are presented in the table below

| Term | Setting A | Setting B | Description |
|---|---|---|---|
| $n_{dim}$ | 2 | 2 | Number of dimensions |
| $n_{tilesdim}$ | [1 1] | [4 4] | Number of tiles per dimension |
| $n_{layers}$ | 5 | 1 | Number of layers |

Figure 7:
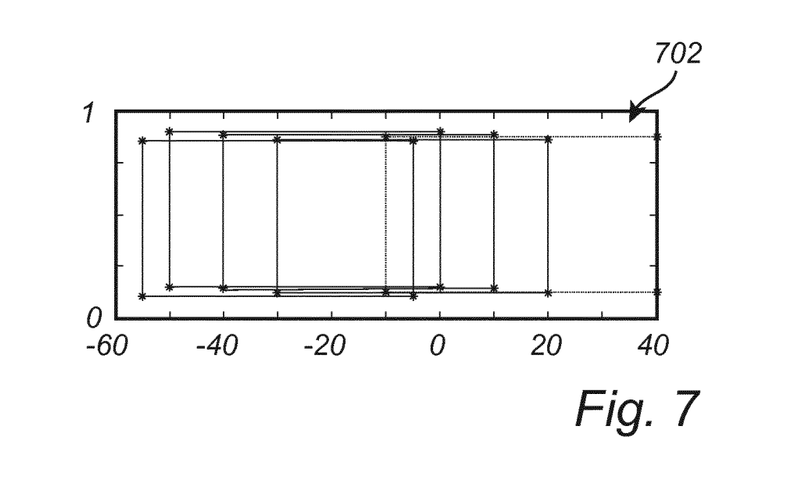
Figure 8A:
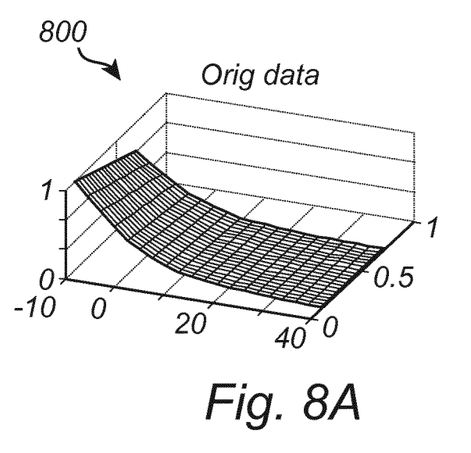
Figure 8B:
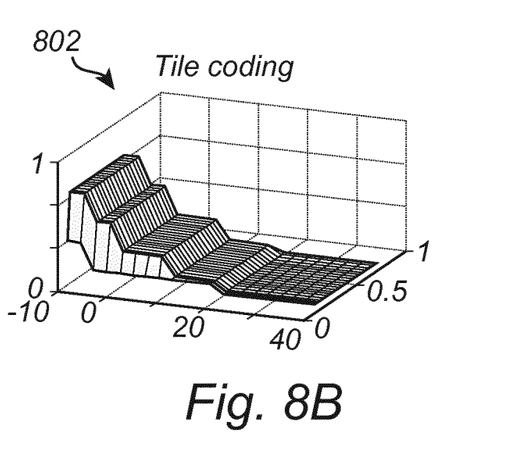

The placement of the layers is illustrated in FIG. 7. FIG. 8A illustrates the original function, and as illustrated in FIG. 8B, the layer offsets provided by setting A are adequate for the original function 800 function to be presented by the tile coding model 802. From FIG. 7, it can further be seen that many layers are overlapping where the function has high values, i.e. for x-values between −10 and 10. Furthermore, only one layer 702 is covering the region where the function has low values. One consequence of this is that a training point with an x-value lower than 20 will not affect how the tile coding presents points with x-values exceeding 20.

Figure 8C:
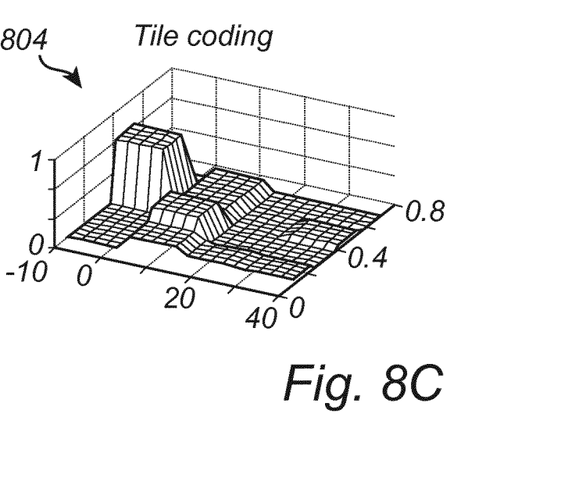

FIGS. 8B and 8C presents the result for the proposed settings A and setting B presented in the table above. Here it can be seen that tile setting A outperforms tile setting B since tile setting A gives a more accurate representation of the original function. The reason is generalization. In tile setting B a training point only influences a small sub-region in the xy-plane, whereas in tile setting A single training point influences the entire xy-plane defined (−50, 0.1) to (40, 0.7). The layer offset can be seen as representing the inner structure/correlation of the function to be estimated. If the offset is properly defined, the tile code representation will converge to the reference function with only few iterations. Accordingly, as can be seen from the illustrated examples, tile coding preferably used since it is understandable, and more controllable in comparison to e.g. neural networks.

Thereby, based on the above described features of a tile coding model, the properties of a tile coding model can be defined for a specific battery cell to provide a function approximator estimating a battery property as a function of two or more measured battery parameters. In an online application where the model is employed in a vehicle, the cell model gives the battery property such as $R_0$ for a given temperature which is then used to train the function approximator.

Figure 9:
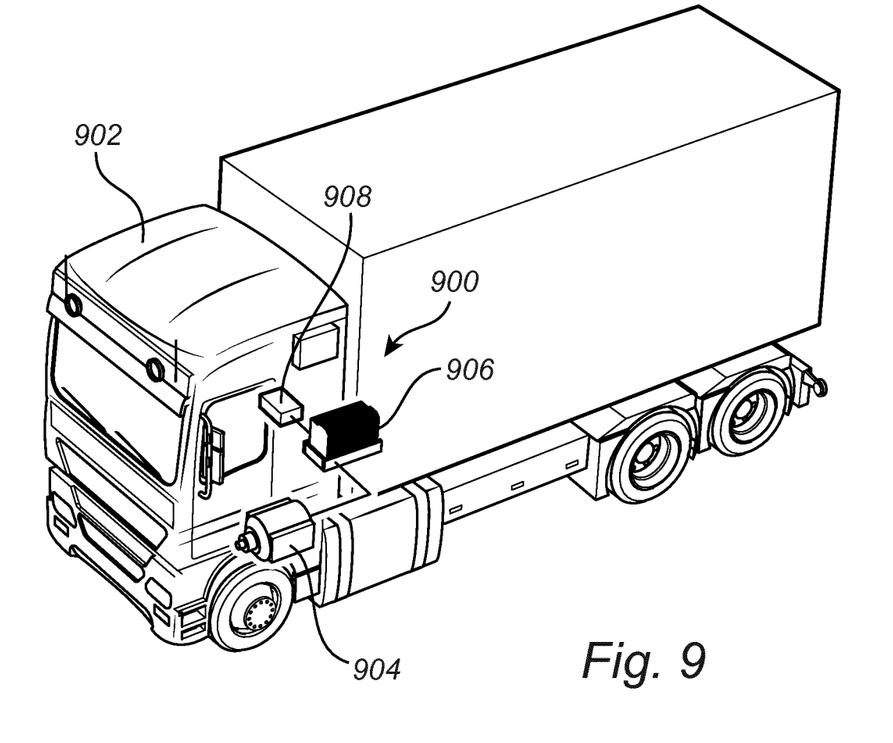

FIG. 9 schematically illustrates an electrical drive system 900 for a vehicle 902. The drive system comprises: an electrical motor 904 arranged to power to a propulsion system of a vehicle; at least one battery 906 connected to the electrical motor to provide power to the electrical motor; and a drive system control unit 908 configured to: provide a stream of measured battery parameter values as a function of time for a predetermined period to a predetermined battery cell model describing the relationship between the measured battery parameter and the battery property; determine a battery property value using the cell model based on a selected portion of the stream of measured battery parameter values; determine if a predetermined condition for the selected portion of the stream of measured battery parameter values is fulfilled; and if the predetermined condition is fulfilled, update a function approximator estimating a battery property as a function of two or more measured battery parameters based on the battery property value determined by the cell model.

The control unit 908 may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device.

It is to be understood that the present invention is not limited to the embodiments described above and illustrated in the drawings; rather, the skilled person will recognize that many changes and modifications may be made within the scope of the appended claims.

The invention claimed is:

1. A method of determining a model for estimating battery properties in a hybrid or electrical drive system of a vehicle, the method comprising:
    providing a function approximator in the form of a tile coding model estimating a battery property as a function of two or more measured battery parameters;
    providing a stream of measured battery parameter values as a function of time for a predetermined period to a predetermined battery cell model describing the relationship between the measured battery parameter values and the battery property;
    determining a battery property value using the cell model based on a selected portion of the stream of measured battery parameter values;
    determining if a predetermined condition for the selected portion of the stream of measured battery parameter values is fulfilled; and
    if the predetermined condition is fulfilled, updating the function approximator based on the battery property value determined by the cell model.

2. The method according to claim 1, wherein determining if a predetermined condition is fulfilled comprises, for the selected portion of the stream of measured battery parameter values:
    determining if a predetermined time period has passed since the most recent update of the function approximator;
    determining if a standard deviation of a measured current exceeds a predetermined threshold;
    determining if a maximum current derivative occurs before the middle of the selected portion;
    and/or determining if a maximum current derivative exceeds a predetermined threshold.

3. The method according to claim 2, further comprising:
    if each of the plurality of predetermined conditions are fulfilled, determining the battery property value using the cell model based on the stream of measured battery parameter values; and
    updating the function approximator based on the battery property value determined by the cell model.

4. The method according to claim 1, wherein the measured battery parameters comprise at least two of $i_{cell}$, T and, $u_{cell}$, wherein $i_{cell}$ is the current from the battery, T is the temperature of the battery, $u_{cell}$ is the voltage over the battery cell.

5. The method according to claim 1, wherein the determined battery property is at least one of $R_0$, $R_1$ and C in an equivalent circuit representing the battery cell, wherein $R_0$ is the internal resistance of the battery, $R_1$ is a polarization resistance and C is the battery cell capacitance.

6. The method according to claim 1, wherein providing the function approximator comprises training the function approximator for a specific battery type prior to applying the function approximator in the drive system of a vehicle.

7. The method according to claim 1, wherein the selected portion of the stream of measured battery parameter values is selected using a moving time window.

8. The method according to claim 1, further comprising determining a state of charge based on the measured battery parameter values.

9. The method according to claim 1, wherein the function approximator utilizes the tile coding model, the tile coding model comprising a plurality of at least partially overlapping layers having predetermined relative layer offsets and layer weights based on an expected behavior of the battery property for a known battery type.

10. The method according to claim 9, where the plurality of layers are arranged so that there are more overlapping layers in a region where the battery property is expected to exhibit higher variability compared to in a region where the battery property is expected to exhibit lower variability.

11. The method according to claim 9, wherein updating the function approximator comprises modifying a layer offset of at least one layer of the tile coding model.

12. The method according to claim 10, wherein updating the function approximator comprises modifying a weight of a layer of at least one layer of the tile coding model.

13. A computer readable medium carrying a computer program comprising program code for performing the method of claim 1 when the computer program is run on a computer.

14. An electrical drive system for a vehicle, the drive system comprising:
- an electrical motor arranged to power to a propulsion system of a vehicle;
- at least one battery connected to the electrical motor to provide power to the electrical motor;
- a drive system control unit configured to:
  provide a stream of measured battery parameter values as a function of time for a predetermined period to a predetermined battery cell model describing the relationship between the measured battery parameter values and a battery property;
  determine a battery property value using the cell model based on a selected portion of the stream of measured battery parameter values;
  determine if a predetermined condition for the selected portion of the stream of measured battery parameter values is fulfilled; and
  if the predetermined condition is fulfilled, update a function approximator being in the form of a tile coding model estimating the battery property as a function of two or more measured battery parameters, based on the battery property value determined by the cell model.

15. The drive system according to claim 14, wherein the drive system control unit is further configured to, for the selected portion of the stream of measured battery parameter values:
- determine if a predetermined time period has passed since the most recent update of the function approximator;
- determine if a standard deviation of a measured current exceeds a predetermined threshold;
- determine if a maximum current derivative occurs before the middle of the selected portion;
- and/or determine if a maximum current derivative exceeds a predetermined threshold.

16. The drive system according to claim 15, wherein the drive system control unit is further configured to, if each of the plurality of predetermined conditions are fulfilled:
- determine the battery property value using the cell model based on the stream of measured battery parameter values; and
- update the function approximator based on the battery property value determined by the cell model.

17. A vehicle comprising an electrical drive system according to claim 14.

* * * * *